United States Patent
Sudre

(10) Patent No.: US 12,331,395 B2
(45) Date of Patent: Jun. 17, 2025

(54) METHOD OF REPAIRING CERAMIC COMPOSITE ARTICLES

(71) Applicant: RTX Corporation, Farmington, CT (US)

(72) Inventor: Olivier H. Sudre, Glastonbury, CT (US)

(73) Assignee: RTX CORPORATION, Farmington, CT (US)

( * ) Notice: Subject to any disclaimer, the term of this patent is extended or adjusted under 35 U.S.C. 154(b) by 99 days.

(21) Appl. No.: 17/150,451

(22) Filed: Jan. 15, 2021

(65) Prior Publication Data

US 2022/0228256 A1 Jul. 21, 2022

(51) Int. Cl.
| | |
|---|---|
| C23C 16/04 | (2006.01) |
| C04B 41/00 | (2006.01) |
| C04B 41/45 | (2006.01) |
| C23C 16/02 | (2006.01) |
| C23C 16/32 | (2006.01) |
| C23C 16/455 | (2006.01) |
| C23C 16/48 | (2006.01) |
| F01D 5/00 | (2006.01) |

(52) U.S. Cl.
CPC ........ *C23C 16/047* (2013.01); *C04B 41/0036* (2013.01); *C04B 41/4531* (2013.01); *C23C 16/0227* (2013.01); *C23C 16/32* (2013.01); *C23C 16/325* (2013.01); *C23C 16/45563* (2013.01); *C23C 16/483* (2013.01); *F01D 5/005* (2013.01); F05D 2230/314 (2013.01); F05D 2300/6033 (2013.01)

(58) Field of Classification Search
None
See application file for complete search history.

(56) References Cited

U.S. PATENT DOCUMENTS

| | | | | |
|---|---|---|---|---|
| 5,113,582 | A | * | 5/1992 | Monson ................. F01D 5/286 416/241 A |
| 5,190,611 | A | | 3/1993 | Cologna et al. |
| 5,419,927 | A | * | 5/1995 | Dietrich ............. C04B 41/5053 428/408 |

(Continued)

FOREIGN PATENT DOCUMENTS

| | | | |
|---|---|---|---|
| CN | 111018568 A | 4/2020 | |
| FR | 2548218 A * | 1/1985 | ........... C23C 16/481 |

(Continued)

OTHER PUBLICATIONS

See "Area." Merriam-Webster.com Dictionary, Merriam-Webster (2019), https://www.merriam-webster.com/dictionary/area. as captured by Internet Archieve Wayback Machine, https://web.archive.org/web/20191014154205/https://www.merriam-webster.com/dictionary/area (Year: 2019).*

(Continued)

*Primary Examiner* — Jose I Hernandez-Kenney
(74) *Attorney, Agent, or Firm* — CANTOR COLBURN LLP

(57) ABSTRACT

A method of repairing an article including cleaning a repair area, wherein the repair area comprises a ceramic matrix composite; and depositing a ceramic material in the cleaned repair area using laser assisted chemical vapor deposition. Also disclosed is a repaired ceramic composite produced by this method.

12 Claims, 1 Drawing Sheet

(56) References Cited

U.S. PATENT DOCUMENTS

| | | | |
|---|---|---|---|
| 5,965,266 A * | 10/1999 | Goujard | C04B 35/62884 427/419.7 |
| 7,500,833 B2 | 3/2009 | Bublath et al. | |
| 9,366,140 B2 | 6/2016 | Chamberlain | |
| 9,527,170 B2 | 12/2016 | Czerner | |
| 2008/0085413 A1* | 4/2008 | Shimoda | C23C 16/483 118/620 |
| 2008/0229567 A1* | 9/2008 | Bublath | B23P 6/005 29/889.7 |
| 2014/0163717 A1 | 6/2014 | Das et al. | |
| 2015/0064363 A1* | 3/2015 | Matthews | C23C 16/4488 427/586 |
| 2015/0251959 A1* | 9/2015 | Goujard | C04B 35/80 427/255.12 |
| 2016/0279744 A1 | 9/2016 | Harris | |

FOREIGN PATENT DOCUMENTS

| | | | |
|---|---|---|---|
| FR | 3096678 A1 * | 12/2020 | C04B 35/80 |
| WO | 2014149124 A1 | 9/2014 | |

OTHER PUBLICATIONS

See "be" Merriam-Webster.com Dictionary (2019), https://www.merriam-webster.com/dictionary/be. as captured by Internet Archive Wayback Machine, https://web.archive.org/web/20190622113439/https://www.merriam-webster.com/dictionary/be (Year: 2019).*

"Trailing edge". Merriam-Webster.com Dictionary, Merriam-Webster, https://www.merriam-webster.com/dictionary/trailing%20edge. Accessed Oct. 28, 2020. Via web.archive.org. (Year: 2020).*

Cai et al. "Growth mechanism of porous 3C-SiC films prepared via laser chemical vapor deposition". Ceramics International (Jul. 2020). vol. 46, Issue 10, Part B (Year: 2020).*

Mi et al. " Thermodynamics, Kinetics, and Microstructure of Laser Chemical Vapor Deposition of SiC". Journal of the American Ceramic Society (2006). vol 89 [2] p. 519-526 (Year: 2006).*

Allen, "Laser chemical vapor deposition: A technique for selective area deposition", J. Appl. Phys. 52(11), Nov. 1981, pp. 6501-6505.

Fujie et al., "Laser chemical vapor deposition of SiC films with CO2 laser", Journal of Alloys and Compounds, vol. 502, Issue 1, Jul. 16, 2010, Abstract only.

European Search Report issued Jun. 13, 2022, Application No. 22150980.5 (7 pages).

Wikipedia, "Laser chemical vapor deposition", retrieved from https://en.wikipedia.org/w/index.php?title=Laser_chemical_vapor_deposition&oldid=962439255 (2020).

* cited by examiner

METHOD OF REPAIRING CERAMIC COMPOSITE ARTICLES

BACKGROUND

Exemplary embodiments pertain to the art of ceramic composites, more specifically to the art of repairing ceramic composite articles.

Ceramic composite articles, especially those used in turbine applications, experience a range of environmental degradation mechanisms. In order to protect the composites, a barrier formed from several layers is applied on the surface.

The articles are exposed to high velocity oxidative conditions including moisture that may cause gradual erosion of the barrier. The barrier may also prematurely chip off due to micro-impacts or a combination of incipient defects and local stress fields. As a result, an area of a size of a few square millimeters to several square centimeters of composite substrate may be exposed. It is expected that under those conditions the life of the component is limited as the substrate erodes very quickly under high velocity water vapor-containing flow and should be either replaced or repaired. Thus, there is an ongoing need for methods to repair a ceramic composite article.

BRIEF DESCRIPTION

Disclosed is a method of repairing an article including cleaning a repair area, wherein the repair area comprises a ceramic matrix composite; and depositing a ceramic material in the cleaned repair area using laser assisted chemical vapor deposition.

In addition to one or more of the features described above, or as an alternative to any of the foregoing embodiments, cleaning the repair area includes grinding and/or contacting the repair area with an oxidant, halogen, energy from an ultraviolet laser, or combination thereof.

In addition to one or more of the features described above, or as an alternative to any of the foregoing embodiments, cleaning the repair area includes contacting the repair area with energy from an ultraviolet laser. The ultraviolet laser may be operated in pulsed mode.

In addition to one or more of the features described above, or as an alternative to any of the foregoing embodiments, the deposited ceramic material includes silicon carbide (SiC), boron carbide ($BC_x$), boron silicon carbide ($BSiC_x$), hafnium carbide (HfC), zirconium carbide (ZrC), or a combination thereof.

In addition to one or more of the features described above, or as an alternative to any of the foregoing embodiments, the ceramic material has less than 10% porosity.

In addition to one or more of the features described above, or as an alternative to any of the foregoing embodiments, the repair area includes silicon carbide (SiC), boron carbide ($BC_x$), boron silicon carbide ($BSiC_x$), hafnium carbide (HfC), zirconium carbide (ZrC), or a combination thereof.

In addition to one or more of the features described above, or as an alternative to any of the foregoing embodiments, the repair area includes a cooling hole.

In addition to one or more of the features described above, or as an alternative to any of the foregoing embodiments, the repair area includes a trailing edge.

In addition to one or more of the features described above, or as an alternative to any of the foregoing embodiments, the laser assisted chemical vapor deposition uses a gas nozzle that is co-linear with the laser.

In addition to one or more of the features described above, or as an alternative to any of the foregoing embodiments, depositing the ceramic material includes orienting a gas nozzle and a laser relative to the repair area using an articulated arm.

In addition to one or more of the features described above, or as an alternative to any of the foregoing embodiments, the article is located in a vacuum chamber with a flowing gas precursor and depositing the ceramic material includes the laser locally heating the surface to convert the gas precursor to the ceramic material.

In addition to one or more of the features described above, or as an alternative to any of the foregoing embodiments, the repair area is located below the surface of the article and the method further comprises exposing the repair area.

In addition to one or more of the features described above, or as an alternative to any of the foregoing embodiments, the repair area has a size of 50 micrometers to 50 millimeters.

Also disclosed is a repaired ceramic composite article including a repaired area consisting of silicon carbide, boron carbide ($BC_x$). boron silicon carbide ($BSiC_x$), or a combination thereof and having a porosity less than 10%.

In addition to one or more of the features described above, or as an alternative to any of the foregoing embodiments, the repaired area has a size of 50 micrometers to 50 millimeters.

In addition to one or more of the features described above, or as an alternative to any of the foregoing embodiments, the repaired area includes a cooling hole.

In addition to one or more of the features described above, or as an alternative to any of the foregoing embodiments, the repaired area includes a trailing edge.

In addition to one or more of the features described above, or as an alternative to any of the foregoing embodiments, the repaired area corrects a defect located below a surface of the article.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As discussed above, a ceramic composite erodes quickly under conditions that include mechanical impact damage, a high velocity water vapor-containing flow, and combinations thereof. The eroded area may be repaired by filling with a portion of the barrier material when the barrier material is reapplied but the barrier material typically is different in composition from the ceramic composite. It is more desirable to replace the ceramic composite with a material that comprises a component of the composite, typically the matrix material or a component of the matrix material. This results in a more robust repair. For example, the thermal conductivity of silicon carbide (SiC) is closer than the thermal conductivity of the barrier material to the thermal conductivity of ceramic composite. Accordingly repairing a damaged area with SiC or similar material results in a component with less heterogeneity than one repaired with barrier material.

Disclosed herein is a method of repairing a ceramic composite article. The method includes cleaning the area needing repair (referred to as the repair area) and then depositing ceramic material in the cleaned repair area using laser assisted chemical vapor deposition. The deposited ceramic material may include material used in the matrix of the ceramic composite article.

The repair area may be cleaned using a mechanical method such as grinding, an oxidant gas, a halogen gas, an ultraviolet (UV) laser, or a combination thereof. Cleaning removes unwanted oxide or carbide phases that may interfere with the deposition of the ceramic material. Exemplary oxidants include $H_2O$ Exemplary halogens include HCl, $Cl_2$, and HF. The repair area may be contacted with the oxidant, halogen, UV laser, or combination thereof. The laser may be used in a pulsed mode to deposit energy to a limited depth.

After cleaning the repair area, ceramic material is deposited using laser assisted chemical vapor deposition. A gas precursor is injected into the area of the repair area and the laser heats the repair area to provide energy to convert the precursor to the deposited ceramic material. Because the precursor is converted to the product on site there are little or no side products. This contrasts with molten methods which can also deposit undesirable side products which can affect the performance of the deposited material. Exemplary undesirable side products include low melting point products from residual molten phases. The ceramic material deposited using laser assisted chemical vapor deposition has less than 10%, or less than 5%, or less than 2% porosity.

Figure 1:
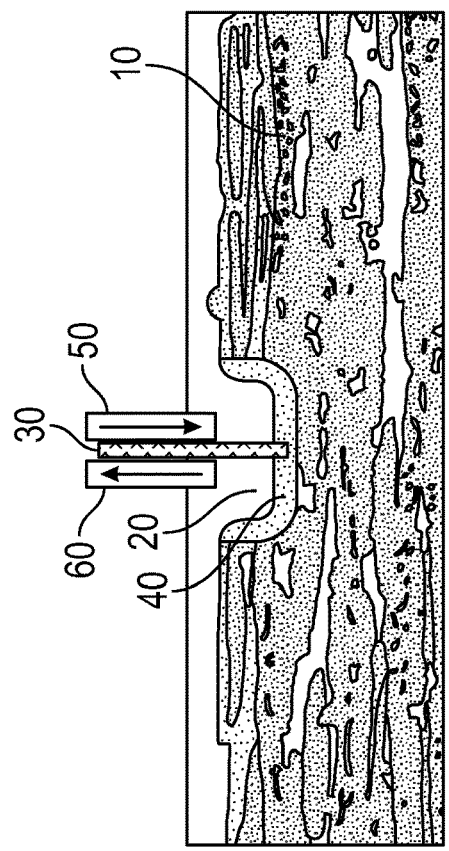
FIG. 1 illustrates a repair of a ceramic matrix composite article.

FIG. 1 shows a ceramic matrix composite 10 having a repair area 20. Laser beam 30 heats the repair area 20 and assists chemical vapor deposition of material 40 in repair area 20. Precursor inlet 50 provides the precursor for chemical vapor deposition. Outlet vacuum 60 provides local exhaust for the reaction product and avoids contamination of the part surfaces.

Figure 2:
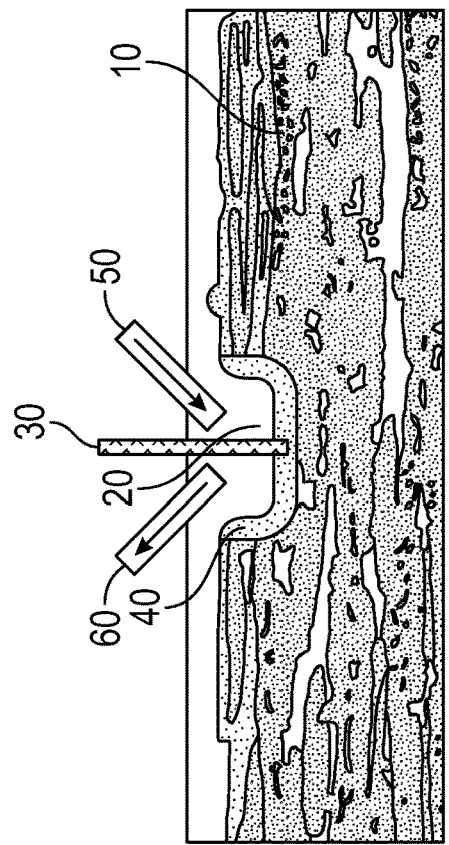
FIG. 2 illustrates another embodiment of a repair of a ceramic matrix composite article.

FIG. 2 is similar to FIG. 1 but shows the precursor inlet 50 as co-linear with the laser beam 30.

Exemplary precursor materials are those known to be useful in chemical vapor deposition and include methyl trichlorosilane (MTS), vinyltrichlorosilane, hexamethyldisilane, and other chlorides or mixture of gases such as $SiCl_4$, $BCl_3$ with $CH_4$, $C_2H_4$, typically know to the art of CVD. Exemplary deposited ceramic materials include silicon carbide (SiC), boron carbide ($BC_x$), boron silicon carbide ($BSiC_x$), hafnium carbide, zirconium carbide, and combinations thereof.

The laser may raster the area and/or be used in a pulsed mode to limit the amount of heating of the substrate. As mentioned above a UV laser may be used for cleaning. Exemplary lasers for laser assisted chemical vapor deposition include lasers that couple with the surface of the repair area to heat the surface such as infrared lasers and carbon dioxide lasers. The atmosphere may include inert gases or catalyst gases such as $H_2$. The pressure of the chamber can be controlled to tailor the rate of reaction. The repair area may be preheated. The nozzle used to provide the precursor material to the repair area may be co-linear or co-axial with the laser. The nozzle and the laser may be oriented relative to the repair area using an articulated arm that can control the orientation of the nozzle and laser independently or jointly. Alternatively, the component can be affixed to an articulated arm and the laser and nozzle fixed. The gas can also be provided in the chamber independently of the laser.

The repair area of the ceramic composite may include silicon carbide, boron carbide ($BC_x$), boron silicon carbide ($BSiC_x$), hafnium carbide, zirconium carbide, and combinations thereof. The repair area may have a size of 50 microns to 50 millimeters (mm) or 100 microns to 5 mm. The repair area may include a feature such as a cooling hole or an edge such as a trailing edge. Repair of such features has previously proved difficult. With laser assisted chemical deposition the laser pattern can be altered for the repair of features without the need for subsequent machining.

It is further contemplated that the above described repair method may be employed to repair a defect, such as a pore or crack, in a ceramic composite. In these instances the method may further include removing a portion of the barrier material.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of repairing an article comprising:
cleaning a repair area wherein cleaning the repair area comprises contacting the repair area with an oxidant, halogen, or combination thereof,
wherein the repair area comprises a ceramic matrix composite; and
depositing a ceramic material in the cleaned repair area using laser assisted chemical vapor deposition;
wherein the deposited ceramic material includes material used in the matrix of the ceramic matrix composite; and
wherein the deposited ceramic material has less than 10% porosity; and
wherein the article is located in a vacuum chamber with a flowing gas precursor and depositing the ceramic material comprises locally heating the repair area with a laser to convert the gas precursor to the ceramic material, wherein the laser rasters the repair area; and
wherein the method of repairing the article is not a molten method.

2. The method of claim 1, wherein cleaning the repair area further comprises contacting the repair area with energy from an ultraviolet laser.

3. The method of claim 2, wherein the ultraviolet laser is in pulsed mode.

4. The method of claim 1, wherein the deposited ceramic material comprises silicon carbide (SiC), boron carbide ($BC_x$), boron silicon carbide ($BSiC_x$), hafnium carbide (HfC), zirconium carbide (ZrC), or a combination thereof.

5. The method of claim 1, wherein the repair area comprises silicon carbide (SiC), boron carbide ($BC_x$), boron silicon carbide ($BSiC_x$), hafnium carbide (HfC), zirconium carbide (ZrC), or a combination thereof.

6. The method of claim 1, wherein the repair area comprises a cooling hole.

7. The method of claim 1, wherein the repair area comprises a trailing edge.

8. The method of claim 1, wherein the laser assisted chemical vapor deposition uses a gas nozzle that is colinear with a laser.

9. The method of claim 1, wherein depositing the ceramic material comprises orienting a gas nozzle and a laser relative to the repair area using an articulated arm.

10. The method of claim 1, wherein the repair area is located below the surface of the article and the method further comprises exposing the repair area.

11. The method of claim 1, wherein the repair area is preheated.

12. A method of repairing an article comprising:
cleaning a repair area, wherein cleaning the repair area comprises contacting the repair area with an oxidant, halogen, or combination thereof;
wherein the repair area comprises a ceramic matrix composite; and
depositing a ceramic material in the cleaned repair area using laser assisted chemical vapor deposition;
wherein the deposited ceramic material includes material used in the matrix of the ceramic matrix composite; and
wherein the repair area comprises boron carbide ($BC_x$), boron silicon carbide ($BSiC_x$), hafnium carbide (HfC), zirconium carbide (ZrC), or a combination thereof; and
wherein the deposited ceramic material has less than 10% porosity;
wherein the article is located in a vacuum chamber with a flowing gas precursor and depositing the ceramic material comprises locally heating the repair area with a laser to convert the gas precursor to the ceramic material, wherein the laser rasters the repair area; and
wherein the method of repairing the article is not a molten method.

* * * * *